United States Patent [19]

Ohkawa

[11] Patent Number: 4,745,336

[45] Date of Patent: May 17, 1988

[54] MICROWAVE GENERATION BY VIRTUAL CATHODE WITH PHASE VELOCITY MATCHING

[75] Inventor: Tihiro Ohkawa, La Jolla, Calif.

[73] Assignee: GA Technologies Inc., San Diego, Calif.

[21] Appl. No.: 867,074

[22] Filed: May 27, 1986

[51] Int. Cl.[4] .............................................. H03B 9/01
[52] U.S. Cl. .......................................... 315/4; 315/3; 315/3.5; 315/5; 315/5.38; 315/5.39; 315/39.53; 331/79; 331/90
[58] Field of Search .................. 315/3, 4, 5, 39, 39.51, 315/39.53, 39.55, 39.61, 5.33, 5.53, 5.54, 3.5; 331/79, 90

[56] References Cited

U.S. PATENT DOCUMENTS

| | | | |
|---|---|---|---|
| 4,143,299 | 3/1979 | Sprangle et al. | 315/5 |
| 4,150,340 | 4/1979 | Kapetanakos et al. | 315/3 |
| 4,159,440 | 6/1979 | Little | 315/3 |
| 4,253,068 | 2/1981 | Barnett | 315/3 |
| 4,345,220 | 8/1982 | Sullivan | 315/39 |
| 4,459,511 | 7/1984 | Alexeff | 315/3 |
| 4,494,039 | 1/1985 | Kim | 315/3 |
| 4,523,127 | 6/1985 | Moeller | 315/5 |
| 4,553,068 | 11/1985 | Brandt | 315/5 |

Primary Examiner—Leo H. Boudreau
Assistant Examiner—Michael J. Nickerson
Attorney, Agent, or Firm—Fitch, Even, Tabin & Flannery

[57] ABSTRACT

The present invention provides a vircator with improved efficiency. An elongated anode is aligned with an elongated cathode so as to produce an elongated virtual cathode when a direct current voltage source is electrically connected to the elongated cathode. A surface wave having a velocity near the velocity of light will be produced on the virtual cathode. Waveguide means enclosing the virtual cathode is disposed so as to propagate microwave radiation in a direction parallel to the direction of elongation of the cathode, anode and virtual cathode. The waveguide is designed to match the phase velocity of the microwave to the velocity of the virtual cathode surface wave.

7 Claims, 1 Drawing Sheet

MICROWAVE GENERATION BY VIRTUAL CATHODE WITH PHASE VELOCITY MATCHING

The present invention relates broadly to microwave generators and, in particular, to a high power microwave generator apparatus utilizing a relativistic electron beam to generate microwave energy as a consequence of induced virtual cathode oscillation.

BACKGROUND OF THE INVENTION

Microwaves can be generated as direct radiation from electrical sparks across gaps at high electric potential. The spark gap can also be a part of a very high frequency oscillating circuit which radiates electromagnetic waves. Microwaves can also be derived from the thermal radiation of warm bodies. Some important microwave generators are klystrons, magnetrons, and traveling wave tube oscillators. Their power outputs range from microwatts to thousands of kilowatts, depending upon the type and design of the generator, the operating frequency and pulse duration.

It is known that microwaves can be produced from an oscillating virtual cathode in a device called the vircator. See for example, H. Sze, et al., "A Radially and Axially Extracted Virtual Cathode Oscillator (Vircator)," IEEE Transactions on Plasma Science, Vol. PS-13, No. 6, December 1985. In the vircator, microwave generation takes place when the injected current of an electron beam machine exceeds the space-charge limiting current of the region behind the anode-cathode gap. When the limiting current is exceeded, electrons accumulate in this region forming a virtual cathode which causes some electrons to be reflected. It is known that the frequency, or frequencies, of the generated microwaves is determined by the transit time of the reflected electrons and the oscillation frequency of the virtual cathode.

SUMMARY OF THE INVENTION

The present invention provides a vircator with improved efficiency. An elongated anode is aligned with an elongated cathode so as to produce an elongated virtual cathode when a direct current voltage source is electrically connected between the elongated cathode and the elongated anode. A surface wave having a velocity near the velocity of light is produced on the virtual cathode. A waveguide means enclosing the virtual cathode is disposed so as to propagate microwave radiation in a direction parallel to the direction of elongation of the cathode, anode and virtual cathode. The waveguide is designed to match the phase velocity of the microwave to the velocity of the virtual cathode surface wave.

DESCRIPTION OF THE PREFERRED EMBODIMENTS

Figure 3:
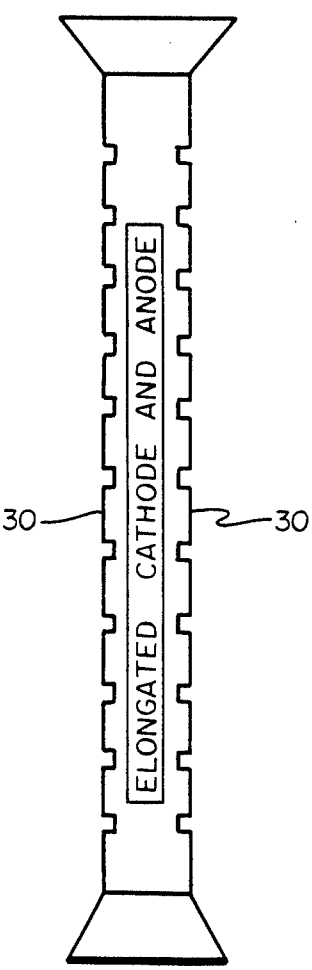
FIG. 3 is a partly diagrammatic illustration of a waveguide having a periodic structure formed by corrugating two of the walls.
Figure 2:
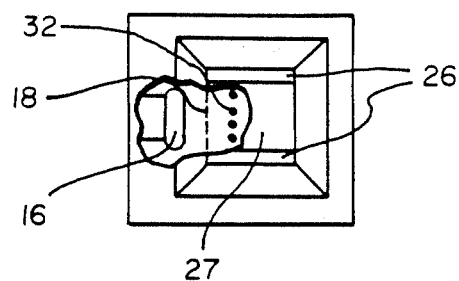
FIG. 2 is an end view of the waveguide portion of the apparatus shown in FIG. 1 with a cutaway portion showing the relative locations of the elongated cathode, the elongated anode and the virtual cathode.

As shown in the drawings, a high power microwave generator apparatus according to a preferred embodiment of the present invention comprises a pulsed high voltage power supply 10 and a rectangular wave-guide tube 12. The parameters of the high voltage power supply are controlled by a control circuit 13. The center conductor 14 of a coaxial transmission line 15 connects a straight elongated cold field emission cathode 16 to one side of the high voltage power supply 10. The high voltage power supply 10 may be a Marx tank capacitor bank system supplied by Maxwell Laboratories of San Diego, Calif., capable of producing an electron beam of 10 to 100 kA by field emission at about 250 to 750 kV for a pulse duration of about 50 to 100 ns. The outer conductor 17 of the coaxial transmission line 15 connects the other (grounded) side of the power supply 10 by way of a chamber wall 19 to the wall 21 of waveguide tube 12. An elongated anode 18 consists of a thin aluminum foil which in this embodiment is a straight part of the waveguide wall 21 parallel to the cathode 16. It is sufficiently thin, preferably about 10 microns or less, so that high energy electrons pass through it with a minimum of dispersion and loss of energy. It should be noted that other anode materials and geometries will also work. Specifically, anodes consisting of mesh screen and honeycomb structure can also be used if they are sufficiently transparent to the electron beam. Preferably 80 percent of the electrons or more should be transmitted through the anode 18. Furthermore, embodiments with both the anode and cathode inside the waveguide structure will also produce microwaves. A vacuum chamber 20 is formed by the chamber wall 19 with microwave windows 22 forming the ends of the chamber 20 to permit microwaves to pass out of the waveguide 12 and vacuum chamber 20. An elongated virtual cathode 32 is formed in the region inside the wall 19 of the waveguide 12 opposite the elongated cathode 16 at about the same distance from the elongated anode as is the elongated cathode. The virtual cathode 32 is generally parallel to the anode 18 and the cathode 16 and develops a surface wave having a velocity approximately equal to the speed of light in the direction of elongation. The waveguide 12 extends parallel to the direction of elongation of the cathode 16 and anode 18. The central cavity of the waveguide 12 comprises three regions: two regions 26 filled with dielectric and a vacuum region 27. The purpose of the dielectric in this embodiment is to provide a waveguide mode with a phase velocity which is matched to the velocity of the surface wave of the virtual cathode. Both the geometry and the dielectric constant will determine the phase velocity of the waveguide mode. Hence for a fixed geometry, phase velocity of the waveguide mode may be easily varied by using materials of different dielectric constants. Various methods of reducing the waveguide phase velocity exist and are standard microwave engineering practice. These methods including the procedure using dielectrics are described in various textbooks, including R. F. Harrington, *Time Harmonic Electromagnetic Field*, McGraw-Hill Book Co. (1961). Chapter 4 of this book is incorporated by reference. One other example of structure for reducing phase velocity is a waveguide with walls containing a periodic structure. Such a periodic structure formed by corrugations on two walls 30 is illustrated in FIG. 3.

Figure 1:
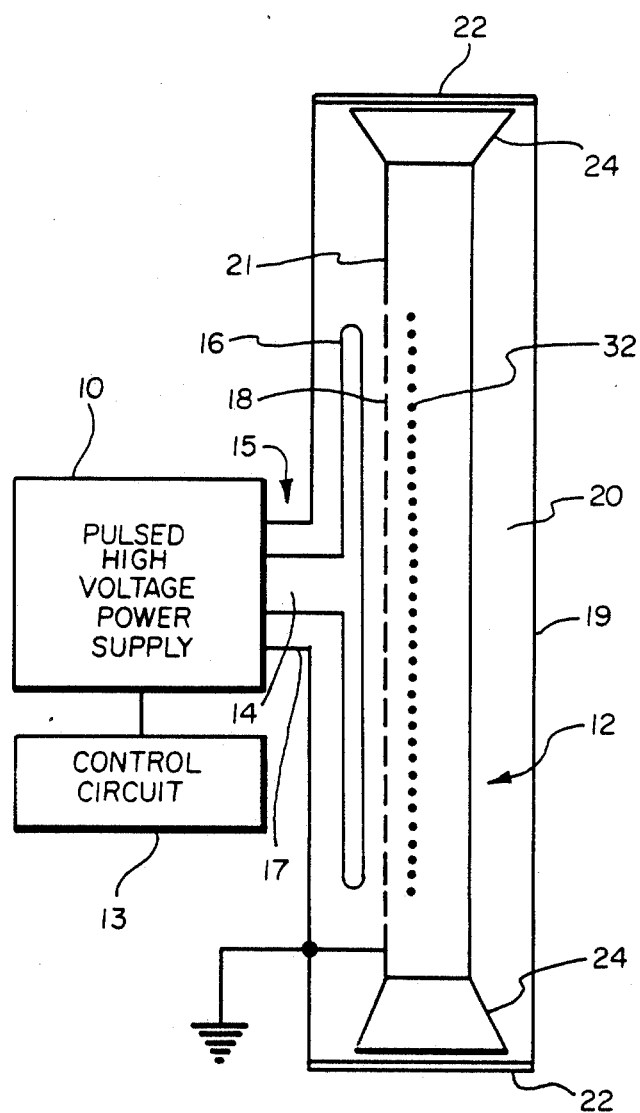
FIG. 1 is an illustration partially diagrammatic of a high power microwave generator apparatus in accordance with the present invention.

In the illustrated embodiment, the elongated cathode has the general shape of a flat surface with dimensions of about 7 cm by 22 cm. The elongated anode surface is slightly larger than that of the cathode and is positioned about 1 cm from the cathode. In order to provide a sufficient region for enhanced microwave emission pursuant to this invention, the longest dimension of the cathode should preferably be at least three times the wavelength of the microwave radiation in the waveguide. In general the power of the microwave radiation can be increased by increasing the elongation; the maximum elongation is limited by the difficulty in maintaining the necessary uniformity of emission from the cathode. The output frequency can be increased by increasing the cathode emission current. In the illustration (FIG. 1) the output microwave would be emitted through both windows 22. The output could be direct to the same or separate loads through appropriate waveguides. Alternatively, one end of the waveguide 12 could be shorted to force the output out the opposite window.

It will be understood that various changes in details, materials, arrangements of parts and operating conditions which have been described and illustrated in order to explain the nature of the invention may be made by those skilled in the art within the principles and scope of this invention.

What is claimed is:

1. A microwave source for generating pulses of microwaves having a dominant frequency comprising:
    a direct current high voltage source;
    an elongated cathode having an emitting surface with a longer dimension and a shorter dimension, said longer dimension being at least three times the wavelength corresponding to the dominant frequency of said microwave pulses;
    an elongated anode aligned parallel to said elongated cathode and laterally spaced therefrom and electron previous over at least an area corresponding to said emitting surface so as to produce an oscillating elongated virtual cathode with a surface wave having a velocity near the velocity of light when the high voltage of said direct current high voltage source is applied between said elongated cathode and said elongated anode; and
    a waveguide enclosing said virtual cathode and disposed to propagate in the direction of the elongation of said elongated cathode, microwave radiation having a phase velocity, said waveguide being constructed such that the phase velocity of said microwave radiation approximately matches the velocity of said virtual cathode surface wave.

2. A microwave source in accordance with claim 1 wherein said voltage source is a pulsed high voltage direct current power supply.

3. A microwave source in accordance with claim 2 wherein said high voltage source is capable of producing an electron beam of about 10 to 100 kA at about 250 to 750 kV for pulse durations of about 50 to 100 ns.

4. A microwave source in accordance with claim 1 wherein said waveguide comprises a dielectric to match the phase velocity of the microwave radiation with the velocity of the virtual cathode surface wave.

5. A microwave source in accordance with claim 1 wherein said waveguide comprises at least one wall with a periodic structure to match the phase velocity of the microwave radiation with the velocity of the virtual cathode surface wave.

6. The microwave source in accordance with claim 1 wherein said longest dimension of said elongated cathode is in excess of 20 cm.

7. The microwave source in accordance with claim 1 wherein said longer dimension of said elongated cathode is at least three times said shorter dimension.

* * * * *